United States Patent

Taniguchi

[15] 3,684,931

[45] Aug. 15, 1972

[54] SEMICONDUCTOR DEVICE WITH COPLANAR ELECTRODES ALSO OVERLYING LATERAL SURFACES THEREOF

[72] Inventor: Hideo Taniguchi, Kyoto, Japan

[73] Assignee: Toyo Electronics Industry Corporation, Kyoto, Japan

[22] Filed: Feb. 22, 1971

[21] Appl. No.: 117,330

[30] Foreign Application Priority Data

Feb. 26, 1970 Japan ......................45/16823
Feb. 28, 1970 Japan ......................45/17271

[52] U.S. Cl. ......................317/234, 29/576, 317/235
[51] Int. Cl..................................................H01l 5/02
[58] Field of Search.......................317/234, 235, 237

[56] References Cited

UNITED STATES PATENTS

| | | | |
|---|---|---|---|
| 2,770,761 | 11/1956 | Pfann | 317/235 |
| 3,184,823 | 5/1965 | Little et al. | 29/25.3 |
| 3,294,988 | 12/1966 | Packard | 310/8 |
| 3,421,946 | 1/1969 | Shaikh et al. | 136/89 |
| 3,525,909 | 8/1970 | Eberhard | 317/234 |

*Primary Examiner*—James D. Kallam
*Attorney*—Christensen & Sanborn

[57] ABSTRACT

An active device pellet comprising a body including a semiconductor base, at least one diffused layer formed on the surface of the body, an electrode formed on said body surface in contact with the diffused layer, and a second electrode having one end connected to the semiconductor base and the other end extending to the surface of said body.

4 Claims, 5 Drawing Figures

PATENTED AUG 15 1972 3,684,931

INVENTOR
HIDEO TANIGUCHI
BY
Christensen & Sanborn
ATTORNEYS

SEMICONDUCTOR DEVICE WITH COPLANAR ELECTRODES ALSO OVERLYING LATERAL SURFACES THEREOF

This invention relates to active device pellets such as transistors, diodes and integrated semiconductor circuits and more particularly to those pellets which are connected to external terminals.

As is well known, one type of active device pellet comprises an N-type epitaxial layer on the surface of an $N^+$-type wafer, and a P-type diffused layer on a part of the surface of the epitaxial layer, and an N-type diffused layer on a part of the surface of the P-type diffused layer. On the external surface of the epitaxial layer there is provided an insulating film of such a material as silicon oxide, parts of which are removed by etching to form holes for access to the diffused layers, and electrodes are affixed to the diffused layers in such a manner as to fill the holes.

In case the pellet is a transistor, these electrodes are the emitter and the base. However, a third electrode, that is, the collector is required. If the pellet is to be connected face-to-face to an external element, it is required that these emitter, base and collector electrodes should be arranged on one and the same surface of the pellet. To enable this, it has hitherto been customary to form an $N^+$-type diffused layer having as high a concentration as the wafer on a part of the epitaxial layer and to form a collector electrode on that added diffused layer by a method similar to that of forming the base and emitter electrodes. This provides all the necessary electrodes on one and the same surface of the pellet to make easy face-to-face connection of the pellet to a desired external element. However, this method requires for the manufacturing process an additional step of forming an $N^+$-diffused layer of a concentration equal to that of the $N^+$ wafer on the epitaxial layer. Moreover, between the added $N^+$-type diffused layer and the P-type diffused layer, an electrically conductive path is formed from the the epitaxial layer once through the high concentration wafer and back to the epitaxial layer, rather than directly through the epitaxial layer. Therefore, the equivalent value of the series resistance between the two layers necessarily becomes greater.

Accordingly, the primary object of this invention is to provide an active pellet which enables easy face-to-face connection to an external element.

Another object of this invention is to provide an active pellet which enables easy surface connection to an external element without forming on the surface of the epitaxial layer any additional $N^+$-diffused layer having as high a concentration as the wafer.

Another object of this invention is to provide an active pellet which enables easy face-to-face connection to external terminals.

In accordance with this invention, an electrode for the semiconductor wafer constituting the base plate of the pellet is extended to the surface of another layer on which the other electrodes of the pellet are formed. With this arrangement, in the previously mentioned example, the P-type diffused layer and the $N^+$-type semiconductor layer are connected by an electrically conductive path passing through the epitaxial layer, without the need of repeatedly passing back and forth the epitaxial layer, as in the prior art pellet, so that the equivalent series resistance between the two layers is much reduced, compared with that of the prior art pellet. Since it is not necessary to provide an additional $N^+$-diffused layer on the surface of the epitaxial layer, the manufacturing process is very much simplified.

To connect the pellet of this invention to a mounting base plate, the electrodes are extended as far as the lateral sides of the pellet body, and the pellet is placed on the mounting base plate, with the upper surface of the pellet on which the electrodes are formed facing the mounting plate, so that the electrodes on the pellet surface contact the terminals on the mounting plate. Then, those portions of the electrodes which appear on the lateral sides of the pellet body are bonded by solder or any other suitable adhesive to the external terminals.

According to this invention, since the electrodes on the pellet are laterally exposed, they are easily seen and it is possible to check whether the bonding work has been well done. Also, a large area on the sides of the pellet is available for bonding, so that the bonding work becomes easier.

The invention will become more apparent from the following description of some preferred embodiments thereof with reference to the accompanying drawings, wherein the same reference numerals in different figures denote corresponding parts, and wherein.

Figure 1:
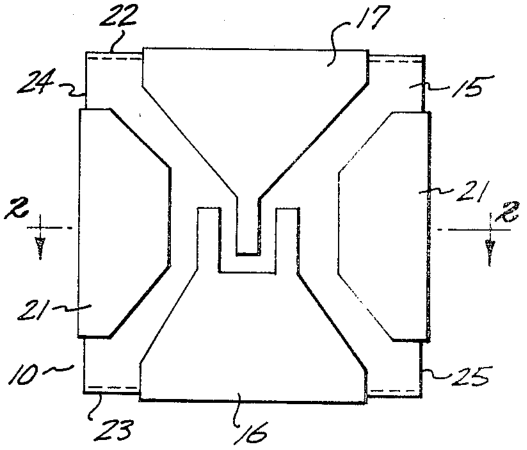
FIG. 1 is a top plan view of one embodiment of the invention.
Figure 2:
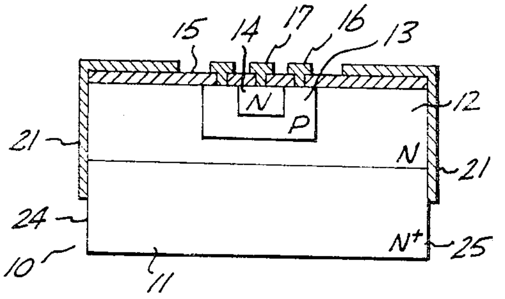
FIG. 2 is a sectional view on line 2—2 of FIG. 1.

Referring first to FIGS. 1 and 2, there is shown a planar type of transistor comprising a pellet body 10 having an N-type epitaxial layer 12 on the surface of a wafer base 11 which is an $N^+$-type layer. On a portion of the surface of the epitaxial layer 12, a P-type diffused layer 13 is provided, and on a part of the surface of the layer 13 an N-type diffused layer 14 is provided. An insulating film 15 of, say, silicon oxide covers the outer surface of the epitaxial layer 12. Those parts of the film 15 which lie on the diffused layers 13 and 14 are partially removed by etching so as to form holes. Electrodes 16 and 17 are formed on the surface of the film 15 in such a manner that their portions fill the holes formed therein. So far the construction is not very different from the prior art pellet. In the illustrated embodiment, however, a pair of electrodes 21 for connection to external elements are provided. Each electrode 21 has one end contacting the lateral surface of the base layer 11 and extends in contact with the lateral surface of the epitaxial layer 12 as far as the other end of the electrodes comes to the upper surface of the pellet body 10. The electrodes 21 as well as the other electrodes 16 and 17 are formed by means of vacuum deposition.

Thus, the electrodes 21 as the collector and the other electrodes 16 and 17 as the base and emitter lie side by side on one and the same surface of the pellet, so that it is possible to connect the pellet face-to-face to a mounting plate. The electrically conductive path between the base and the collector starts from the P-type diffused layer 13 and passes through the epitaxial layer 12 to the wafer base 11, so that the equivalent series resistance of this path is much less than in the prior art arrangement wherein the conductive path farther extends from the wafer back through the epitaxial layer to the $N^+$-type diffused layer added on the surface of the epitaxial layer.

According to this invention since it is not required to form any $N^+$-diffused layer on the surface of the epitaxial layer 12, the manufacturing process is very much simplified. The insulating film 15 covers the lateral surfaces 22 and 23 of the pellet body alone and not the lateral surfaces 24 and 25 thereof.

Figure 3:
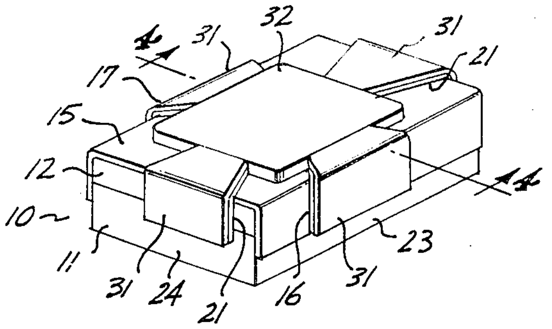
FIG. 3 is a perspective view of another embodiment of the invention.
Figure 4:
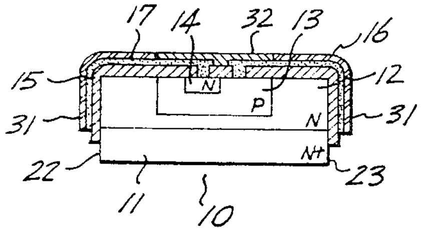
FIG. 4 is a sectional view taken along line 4—4 of FIG. 3.

FIGS. 3 and 4 show another embodiment of the invention, wherein the electrodes 16 and 17 extend down to the lateral surfaces of the pellet body 10 just as the electrodes 21 do. In order to bond these electrodes to external terminals by soldering, they are made of such a material as copper, nickel, silver, or gold which enables soldering. Otherwise, an overlay 31 of such a metallic material as mentioned just above covers each of the electrodes 16, 17 and 21. To protect these portions of the electrodes 16 and 17 which are connected to the diffused layers 13 and 14, a protecting film 32 of, say, silicon oxide covers them.

Figure 5:
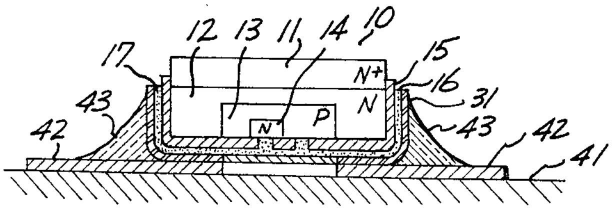
FIG. 5 is a sectional view of the active pellet secured to a mounting plate.

FIG. 5 shows the pellet of FIGS. 3 and 4 bonded to a mounting plate 41. The plate 41 is provided as many terminal conductors 42 as are required. The pellet 10 of FIG. 4 is turned upside down and is put on the mounting base 41 in such a manner that the electrodes on the pellet lie on the relevant terminal conductors 42, and the pellet is soldered at the lateral sides thereof as at 43 to the plate 41. The soldering is performed between the conductors 42 and the metallic overlays 31 covering the portions of the electrodes on the lateral sides of the pellet body 10. Without the metallic overlays 31 soldering is made between the conductors 42 and the electrodes themselves. Instead of solder any other suitable electrically conductive bonding material can be used. In this case no such metallic overlays as 31 are required and bonding is made between the conductors 42 and the electrodes extending over the lateral side surfaces of the pellet 10. With this arrangement, those portions bonded together are exposed on the lateral sides of the pellet and are easily visible, so that it is possible to see whether the bonding work has been effectively done or not. Also, all lateral spaces of the pellet are available for bonding. This makes the bonding work easy and enables bonding at different places at the same time.

What I claim is:

1. An active pellet comprising a semiconductor body; a plurality of diffused layers formed on said body; a plurality of electrodes having their one ends connected to said diffused layers and extending over the lateral side surfaces of said body; and a mounting plate having external terminals formed thereon; said body having its surface on which said diffused layers are formed placed on said mounting plate so that said electrodes on said body surface contact said terminals on said mounting plate, with those portions of said electrodes extending over the lateral sides of said body being bonded to said terminals on said mounting plate.

2. An active device pellet comprising a semiconductor body including a semiconductor base, said body having a first surface and a plurality of lateral surfaces adjoining said first surface; at least one diffused layer formed on said first surface; a first electrode formed on said first surface in contact with said diffused layer; a second electrode formed on said body having a first end formed on and connected to said semiconductor base and a second end extending to and formed on said first surface, both of said first and said second electrodes additionally having portions thereof formed on at least one of said lateral surfaces.

3. The pellet of claim 2 wherein said semiconductor base comprises a high concentration wafer and said diffused layer is formed on an epitaxial layer formed on said wafer.

4. The pellet of claim 2 in combination with a mounting plate member having terminals formed thereon, wherein said pellet body has its first surface on which said first and second electrodes appear placed on said mounting plate member so that first and second electrodes contact said terminals on said mounting plate, with those portions of said first and second electrodes which extend over at least one lateral surface of said pellet body being bonded to said terminals on said mounting plate.

* * * * *